United States Patent [19]

Rubner et al.

[11] 4,088,489
[45] May 9, 1978

[54] METHOD FOR THE PREPARATION OF RELIEF STRUCTURES

[75] Inventors: Roland Rubner, Rottenbach u Forchheim; Wolfgang Kleeberg; Eberhard Kühn, both of Erlangen, all of Germany

[73] Assignee: Siemens Aktiengesellschaft, Berlin and Munich, Germany

[21] Appl. No.: 598,828

[22] Filed: Jul. 24, 1975

[30] Foreign Application Priority Data

Aug. 2, 1974 Germany .............................. 2437422

[51] Int. Cl.² .................................................. G03C 5/00
[52] U.S. Cl. .................................. 96/35.1; 96/115 R; 260/47 CZ; 560/19
[58] Field of Search ................ 96/35.1, 115 R, 115 P; 260/468 J, 47 CZ

[56] References Cited

U.S. PATENT DOCUMENTS

| 3,475,176 | 10/1969 | Rauner .............................. 96/115 R |
| 3,650,746 | 3/1972 | Bailey et al. .......................... 96/35.1 |
| 3,753,720 | 8/1973 | Klowczewski et al. .............. 96/35.1 |
| 3,801,638 | 4/1974 | Ceruonka ............................ 96/115 P |
| 3,847,767 | 11/1974 | Kloczewski .......................... 96/115 P |
| 3,858,510 | 1/1975 | Kai et al. ............................. 96/115 P |
| 3,957,512 | 5/1976 | Kleeberg et al. ..................... 96/35.1 |

*Primary Examiner*—Edward C. Kimlin
*Attorney, Agent, or Firm*—Kenyon & Kenyon, Reilly, Carr & Chapin

[57] ABSTRACT

The invention provides a method for the preparation of relief structures of highly heat-resistant polymers, using radiation-sensitive, soluble preliminary polymers in the form of polyaddition or polycondensation products of polyfunctional carbocyclic or heterocyclic compounds containing radiation-sensitive radicals in ester groups bound to said compounds with diamines, diisocyanates, bis-acid chlorides or dicarboxylic acids of cyclic structure. According to the invention, the polyfunctional compounds carrying the radiation-sensitive radicals have, besides carboxyl, carboxylic acid chloride, amino, isocyanate or hydroxyl groups suitable for addition and condensation reactions, radiation-reactive radicals in the ester-groups bound to the compounds, partly in ortho or peri position thereto of the following structure:

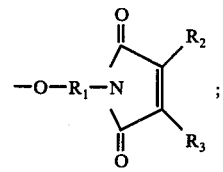

wherein:
$R_1$ = alkylene or aralkylene
$R_2$ = H, $CH_3$, Cl
$R_3$ = H

4 Claims, No Drawings

METHOD FOR THE PREPARATION OF RELIEF STRUCTURES

BACKGROUND OF THE INVENTION

This invention concerns an improvement and further development of the method according to the U.S. patent application Ser. No. 444,552 filed Feb. 21, 1974, now U.S. Pat. No. 3,957,512, herein incorporated by reference for the preparation of relief structures of highly heat-resistant polymers by applying radiation-sensitive, soluble preliminary polymer stages to a substrate in the form of a layer or a foil; irradiating the radiation-sensitive layer or foil through negative patterns; removing nonirradiated layer or foil parts and, optionally, subsequently annealing the relief structures obtained, using polyaddition or polycondensation products of polyfunctional carbocyclic or heterocyclic compounds carrying radiation-sensitive radicals, with diamines, diisocyanates, bis-acid chlorides or dicarboxylic acids as soluble preliminary polymer stages, wherein (a) the polyfunctional compounds carrying radiation-sensitive radicals R* contain two carboxyl, carboxylic acid chloride, amino, isocyanate or hydroxyl groups suitable for addition or condensation reactions and, partly in ortho or peri position thereto, radiation-reactive groups, bound to carboxyl groups as esters of the following structure:

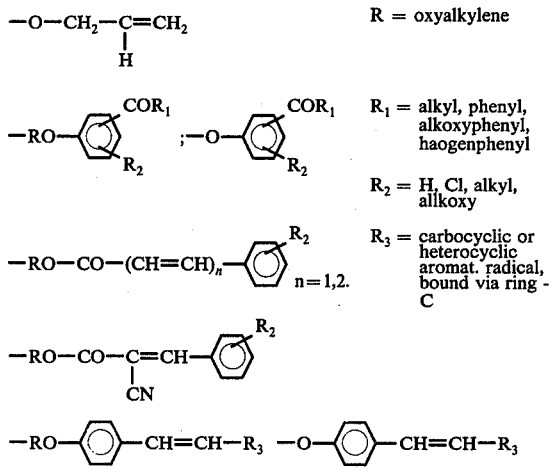

and wherein:

(b) the diamines, disocyanates, bis-acid chlorides or dicarboxylic acids to be reacted with these compounds contain at least one cyclic structure element.

SUMMARY OF THE INVENTION

It has now been found that one can obtain more radiation-sensitive soluble preliminary polymer stages, which require considerably shorter exposure times, if in the preparation of relief structures according to the U.S. patent application Ser. No. 444,552, now U.S. Pat. No. 3,957,512, the radiation-reactive radicals as given under (a), are replaced by radiation-reactive radicals of the following structure:

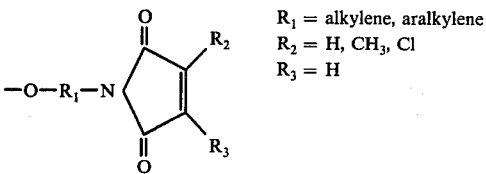

The preliminary polymers are defined, easily prepared compounds, which are stable in storage. They photo-crosslink particularly rapidly and yield in a simple manner highly heat-resistant relief structures with high resolution, excellent insulating properties, outstanding mechanical properties and high chemical stability.

A particularly radiation-sensitive radical is N-(m-$\beta$-oxyethoxy) phenylmaleimide radical.

Of particular advantage are further N-oxymethyl and N-$\beta$-oxyethyl-maleimide radicals since in addition, the components not converted by the radiation cross-linking of the preliminary polymer stages can easily be volatilized as N-hydroxymethyl or N-hydroxyethyl-maleimides, respectively, by annealing the relief structures.

To increase the cross-linking speed, commonly used photo initiators and/or sensitizers can be employed, of. Industrie Chimique Belge, vol. 24, pages 739 to 64 (1959) or Light-Sensitive Systems by J. Kosar, John Wiley & Sons, Inc., New York 1965, pages 143 to 46 and 160 to 88. Highly suited sensitizers and/or initiators are, for instance, Michler's ketone and/or benzoin ether, 2-tert-butyl-9,10-anthraquinone, 1,2-benz-9,10-anthraquinone, 4,4'-bis-(diethylamino)-benzophenone. The soluble preliminary polymer stages can be prepared in a particularly simple and economical manner in a "one pot" reaction, if the solvent hexamethyl phosphoric acid triamide is used.

The method of the present invention allows the preparation of relief structures with sharp edges of highly heat-resistant insulating materials, including miniaturized designs, utilizing the increased light sensitivity of the easily available soluble preliminary polymer stages used. It is preferably applicable to the preparation of protective layers for semiconductor components, particularly of insulating and passivating layers, and in addition, as layers of solder protection paint in multi-layer circuits, as miniaturized insulating layers on electrically conducting and/or semiconducting and/or insulating base materials and for layered circuits, i.e., as insulating layers for printed circuits with conductors prepared by electroplating, as image storage devices that can be read out optically and as high-quality printing forms.

The invention will be explained in further details by the following examples.

EXAMPLE 1

Preparation of the Soluble Preliminary Polymer

Exactly 21.8 parts by weight pyromellitic acid anhydride in 50 parts by volume hexamethyl phosphoric acid triamide were reacted drop-wise, while being ice-cooled and stirred, with 46.6 parts by weight N-(m-$\beta$-hydroxyethoxy)phenylmaleimide in 50 parts by volume hexamethyl phosphoric acid triamide and then stirred at room temperature for 4 days. To the solution were subsequently added drop-wise, at −5° to −10° C, 24 parts by weight thionyl chloride and stirring was continued for two hours. Then a solution of 19.8 parts by weight 4,4'-diaminodiphenyl ether in 50 parts by volume dimethyl acetamide was added drop-wise and allowed to stand overnight without cooling. The soluble preliminary polymer was precipitated by adding the solution drop-wise to 2000 parts by volume water and was then washed with water and ethanol.

Preparation of the Relief Structures

Five parts by weight of the preliminary polymer stage and 0.05 parts by weight Michler's ketone were dissolved in 15 parts by volume dimethyl formamide. The solution was then filtered and centrifuged on aluminum foil to form uniform films, which after evaporation of the solvent were 5 μm thick. The films were irradiated with a 500-W very high-pressure mercury lamp at a distance of 23 cm through a contact negative for 60 sec and were developed for 60 sec in γ-butyrolactone. A resolution of better than 20 μm was achieved with good edge definition. The samples obtained were annealed for 20 min at 300° C. The resolution and edge definition remained unchanged in the process and the relief structures than had the excellent thermal, mechanical, electrical and chemical properties of the polyimide polydiphenyloxidepyromelliticimide. The IR spectrum of the annealed samples exhibited bands at 5.6 μm, typical for the imide structure.

EXAMPLE 2

Preparation of the Soluble Preliminary Polymer Stage 21.8 Parts by weight pyromellitic acid dianhydride in 50 parts by volume hexamethyl phosphoric acid triamide were reacted, while being ice-cooled and stirred, drop-wise with 25.4 parts by weight N-hydroxymethyl maleimide in 50 parts by volume of hexamethyl phosphoric acid triamide and then stirred at room temperature for 4 days. To the solution were subsequently added drop-wise, at −5° to −10° C, 24 parts by weight of thionyl chloride and stirring was continued for two hours. Then, a solution of 19.8 parts by weight 4,4'-diaminodiphenyl methane in 50 parts by volume dimethyl acetamide was added drop-wise, and allowed to stand overnight without cooling.

The soluble preliminary polymer was made up to 2000 parts by volume of water by adding the solution drop-wise and was washed with water an ethanol.

Preparation of Relief Structures

Five parts by weight of the preliminary polymer stage and 0.05 parts by weight Michler's ketone were dissolved in 10 parts by volume dimethyl formamide. Then, the solution was filtered and centrifuged on aluminum foil to form uniform films, which after evaporation of the solvent were 15 μm thick. The films were irradiated, as described in Example 1, for 2 minutes and developed for 1 minute in γ-butyrolactone. A resolution better than 40 μm was obtained with good edge definition. The samples obtained were annealed for 20 minutes at 300° C.

In this process, N-hydroxymethyl maleimide was volatile. The resolution and edge sharpness remained unchanged and the relief structures exhibited the excellent thermal, mechanical, electrical and chemical properties of the polyimide polydiphenylmethane pyromellitic acid imide. The IR spectrum showed the bonds at 5.6 μm typical for the imide structure.

What is claimed is:

1. In a method for the preparation of relief structures consisting of highly heat resistant polymers comprising the steps of applying a soluble, photo or radiation-sensitive prepolymer in the form of a film or foil to a substrate, said prepolymer being a poly-addition or poly-condensation prepolymer having repeating units of the formula

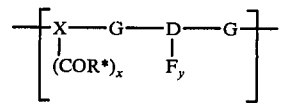

wherein, X and D each comprise a carbocyclic and/or heterocyclic nucleus:

G is selected from the group consisting of amide, urea or urethane linkages;

R* is an organic radical containing a photo- or radiation induced di- or polymerizable olefinic double bond; and is a component of group COR*, said group bound to said nucleus in ortho or peri-position to G;

F is a group capable of reacting with the carbonyl group of COR* to form a cyclic structure upon heating of the prepolymer to liberate R*OH; and wherein F is arranged in ortho- or peri-position to G;

$x$ is 1 or 2; and $y$ is 0 or 2 exposing or irradiating the photo or radiation active layer through a negative pattern, dissolving or stripping the unexposed or unirradiated portions and annealing the relief structure obtained; the improvement which comprises using as said R*, a radical represented by the formula;

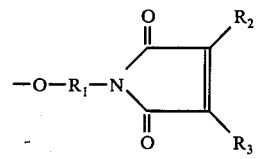

wherein $R_1$ is alkylene or aralkylene; $R_2$ is selected from the group consisting of hydrogen, methyl and chlorine, and $R_3$ is hydrogen.

2. The method of claim 1, wherein the radiation-reactive radical R* is a N-(m-β-oxyethoxy)phenyl maleimide radical.

3. The method of claim 1 wherein the radiation reactive radical R* is a N-oxymethyl or N-β-oxyethyl maleimide radical.

4. The method of claim 1 wherein the soluble prepolymer is prepared in hexamethyl phosphoric acid triamide.

* * * * *